United States Patent [19]

Kimura

[11] Patent Number: 5,583,456
[45] Date of Patent: Dec. 10, 1996

[54] DIFFERENTIALLY COUPLED AND/NAND AND XOR/XNOR CIRCUITRY

[75] Inventor: Katsuji Kimura, Tokyo, Japan

[73] Assignee: NEC Corporation, Tokyo, Japan

[21] Appl. No.: 519,172

[22] Filed: Aug. 25, 1995

[30] Foreign Application Priority Data

Aug. 25, 1994 [JP] Japan .................................. 6-222747

[51] Int. Cl.$^6$ .................................................. H03K 19/20
[52] U.S. Cl. ............................ 326/115; 326/112; 326/121
[58] Field of Search .................................. 326/112, 115, 326/121

[56] References Cited

U.S. PATENT DOCUMENTS

| | | | |
|---|---|---|---|
| 4,558,236 | 12/1985 | Burrows | 326/121 |
| 4,686,392 | 8/1987 | Lo | 326/115 |
| 4,833,347 | 5/1989 | Rabe | 326/115 |
| 5,216,295 | 6/1993 | Hoang | 326/115 |
| 5,332,936 | 7/1994 | Nakao | 326/112 |

*Primary Examiner*—Edward P. Westin
*Assistant Examiner*—Andrew Sanders
*Attorney, Agent, or Firm*—Sughrue, Mion, Zinn, Macpeak & Seas

[57] ABSTRACT

Disclosed is a semiconductor integrated circuit which have a pair of transistors Q11, Q12 with a first polarity being differentially inputted with first logical values A(+) and A(−), a first constant current source I11 for driving the pair of transistors with the first polarity, two pairs of transistors Q13, Q14 and Q15, Q16 with a second polarity, each of the two pairs of transistors being differentially inputted with second logical values B(+) and B(−) and being connected to a drain of each of the pair of transistors with the first polarity, a second and third constant current sources I12, I13 for driving the two pairs of transistors, respectively, and load resistors R11, R12 which are connected to the two pairs of transistors, respectively. The two pairs of transistors Q13–Q16 have one transistor Q13 being connected to one of the load resistors and the other three transistors Q14–Q16 being connected to the other of the load resistors, and an AND output is obtained from a node of one transistor Q13 and the load resistor R11 and an NAND output is obtained from a node of the other three transistors Q14–Q16 and the load resistor R12.

6 Claims, 7 Drawing Sheets

Q51-54: NMOS
I5: CONSTANT-CURRENT SOURCE
R51-52: LOAD RESISTANCE

Q71-72: NMOS
I7: CONSTANT-CURRENT SOURCE
R71-72: LOAD RESISTANCE

|       | O (+) | O (−) |
|-------|-------|-------|
| A (+) | 0     | 1     |
| A (−) | 1     | 0     |

Q23-26: PMOS
Q21-22: NMOS
I21-23: CONSTANT-CURRENT SOURCE
R21-22: LOAD RESISTANCE

| | B (+) | |
|---|---|---|
| | 1 | 0 |
| A (+) 1 | 1 / 0 | 0 / 1 |
| A (+) 0 | 0 / 1 | 0 / 1 |

AND / NAND

Q31-32: PMOS
Q33-36: NMOS
I31-33: CONSTANT-CURRENT
　　　　SOURCE
R31-32: LOAD RESISTANCE

| | B (+) | |
|---|---|---|
| | 1 | 0 |
| A (+) 1 | 0 / 1 | 1 / 0 |
| A (+) 0 | 1 / 0 | 0 / 1 |

EXOR / EXNOR

Q43-46: PMOS
Q41-42: NMOS
I41-43: CONSTANT-CURRENT
         SOURCE
R41-42: LOAD RESISTANCE

DIFFERENTIALLY COUPLED AND/NAND AND XOR/XNOR CIRCUITRY

FIELD OF THE INVENTION

This invention relates to a semiconductor integrated circuit, and more particularly to, a logical circuit which comprises a semiconductor integrated circuit which is provided with a simplified structure of circuit.

BACKGROUND OF THE INVENTION

A conventional semiconductor integrated circuit which comprises an AND/NAND or EXOR/EXNOR circuit and an inverter/non-inverter circuit is known. To equalize the operating points(threshold levels) of both circuits, the integrated circuit has to include a level shift circuit for shifting a level of one operating point to that of the other operating point between the both circuits. This results in a complex structure of the circuit.

SUMMARY OF THE INVENTION

Accordingly, it is an object of the invention to provide a semiconductor integrated circuit in which an AND/NAND or EXOR/EXNOR circuit is cooperated with the inverter/non-inverter circuit as one semiconductor integrated circuit and the operating point of the respective AND/NAND or EXOR/EXNOR circuit and inverter/non-inverter circuit can be equalized each other.

It is a further object of the invention to provide a semiconductor integrated circuit in which a level shift circuit can be omitted to simplify the structure of circuit.

According to the invention, a semiconductor integrated circuit, comprises:

a pair of transistors with a first polarity which form a cross-coupled pair of sources to which first logical values are differentially inputted;

a first constant current source for driving the pair of transistors with the first polarity;

two pairs of transistors with a second polarity, each of the two pairs of transistors forming a cross-coupled pair of sources to which second logical values are differentially inputted and being connected to a drain of each of the pair of transistors with the first polarity;

a second and third constant current sources for driving the two pairs of transistors, respectively; and load resistors which are connected to the two pairs of transistors, respectively.

Hereon, the two pairs of transistors may have one transistor being connected to one of the load resistors and the other three transistors being connected the other of the load resistors, and an AND output can be obtained from a node of the one transistor and one of the load resistors and a NAND output can be obtained from a node of the other three transistors and the other of the load resistors.

Furthermore, the two pairs of transistors may have a first pair of transistors which mutually belong to a different pair of the two pairs of transistors and are inputted with logical values with mutually reverse polarity and are connected to one of the load resistors and a second pair of transistors comprising of the remainder of the two pairs of transistors which are connected to the other of the load resistors, and an EXOR output can be obtained from a node of the first pair of transistors and one of the load resistors and an EXNOR output can be obtained from a node of the second pair of transistors and the other of the load resistors.

Moreover, the semiconductor integrated circuit of the invention may further comprises an inverter/non-inverter circuit which comprises a pair of differential transistors, and the semiconductor integrated circuit and the inverter/non-inverter circuit may form an one-body circuit.

In accordance with the invention, a pair of transistors with a first polarity to which first logical values are differentially inputted and two pairs of transistors with a second polarity to which second logical values are differentially inputted can be operated by an operating point which is determined by the values of the load and the constant current source. Therefore, the operating point can be equalized to the operating point of the inverter/non-inverter circuit to thereby omit a level shift circuit required when forming an AND/NAND or EXOR/EXNOR circuit and the inverter/non-inverter circuit as an one-body semiconductor integrated circuit.

BRIEF DESCRIPTION OF THE DRAWINGS

The invention will be explained in more detail in conjunction with the appended drawings, wherein.

DESCRIPTION OF THE PREFERRED EMBODIMENTS

Before explaining a semiconductor integrated circuit in the preferred embodiment, the aforementioned conventional semiconductor integrated circuits will be explained in FIGS. 1A to 3B.

Figure 1A:
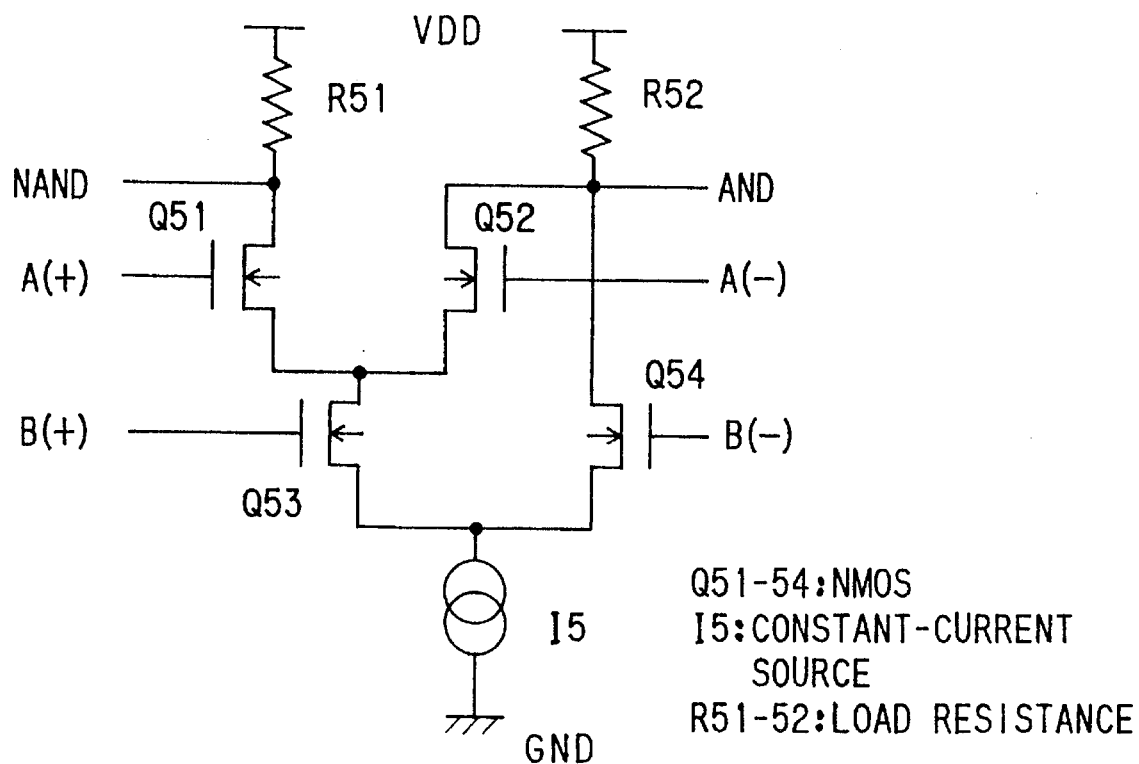
FIG. 1A is a circuit diagram showing a conventional AND/NAND circuit.
Figure 1B:
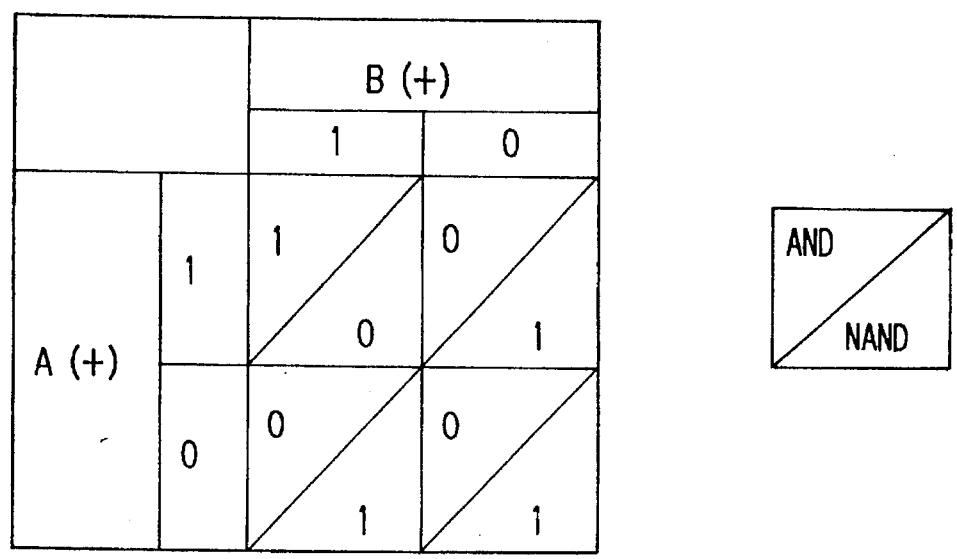
FIG. 1B is a logical table showing AND/NAND outputs obtained the circuit in FIG. 1A.

An example of a conventional AND/NAND circuit comprising a semiconductor integrated circuit is shown in FIG. 1A. This circuit is an example of Gilbert Cell which comprises four N-channel MOS transistors(hereinafter referred to as 'NMOS(or NMOS's)') Q51 to Q54, a constant current source I5 and load resistors R51, R52. Positive and negative logical inputs A, where a positive input is A(+) and a negative input is A(−), are inputted to the gates of NMOS Q51 and Q52, respectively. Positive and negative logical inputs B, where a positive input is B(+) and a negative input is B(−), are inputted to the gates of NMOS Q53 and Q54, respectively. An AND output is obtained from the gates of commonly connected NMOS's Q52 and Q54, respectively, and a NAND output is obtained from the drain of NOMS Q51. The logical table in this circuit is shown in FIG. 1B.

Figures 2A, 2B:
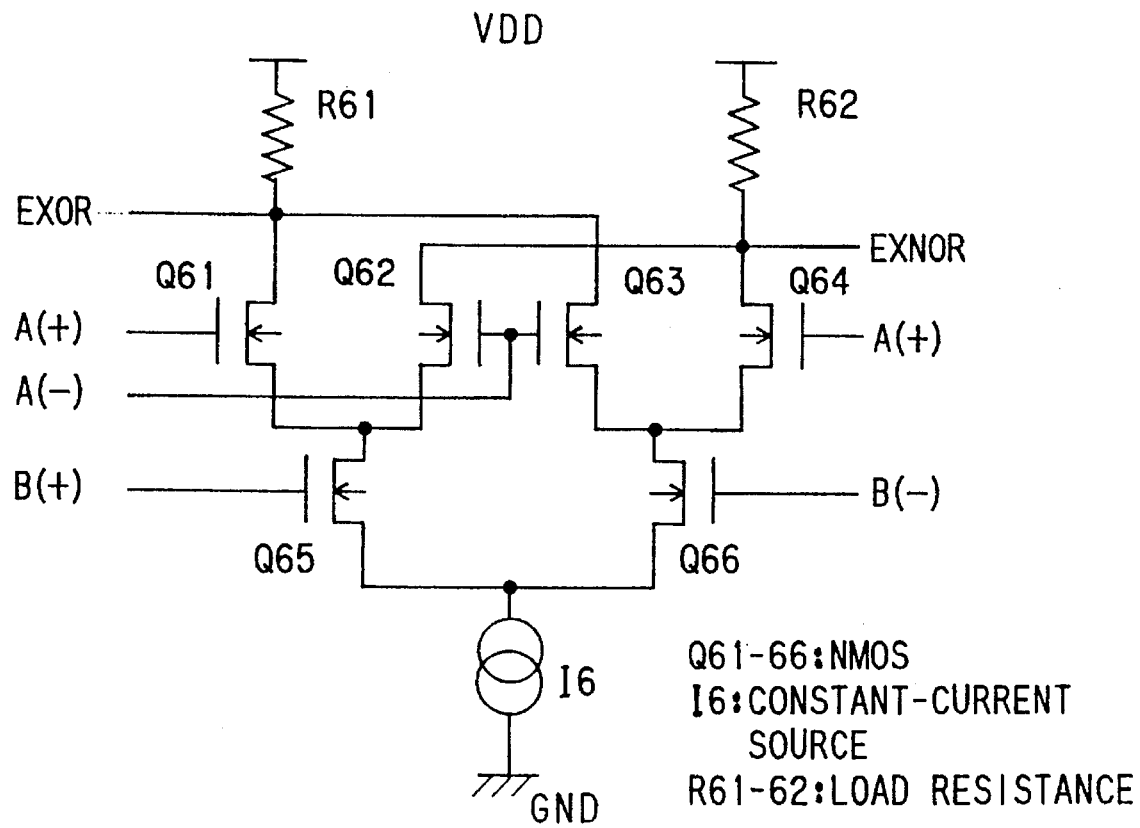
FIG. 2A is a circuit diagram showing a conventional EXOR/EXNOR circuit.
FIG. 2B is a logical table showing EXOR/EXNOR outputs obtained the circuit in FIG. 2A.

Next, an example of a conventional EXOR/EXNOR circuit is shown in FIG. 2A. This circuit comprises six NMOS's Q61 to Q66, a constant current source I6 and load resistors R61, R62. Positive logical inputs A(+) are inputted to the gates of NMOS Q61 and Q64, respectively. Negative logical inputs A(−) are inputted to the gates of NMOS Q62 and Q63, respectively. Positive and negative logical inputs B(+), B(−), respectively are inputted to NMOS's Q65 and Q66, respectively. An EXOR output is obtained from the drains of NMOS's Q62 and Q64, respectively, and an EXNOR output is obtained from the drains of NOMS's Q61 and Q63, respectively. The logical table in this circuit is shown in FIG. 2B.

Figures 3A, 3B:
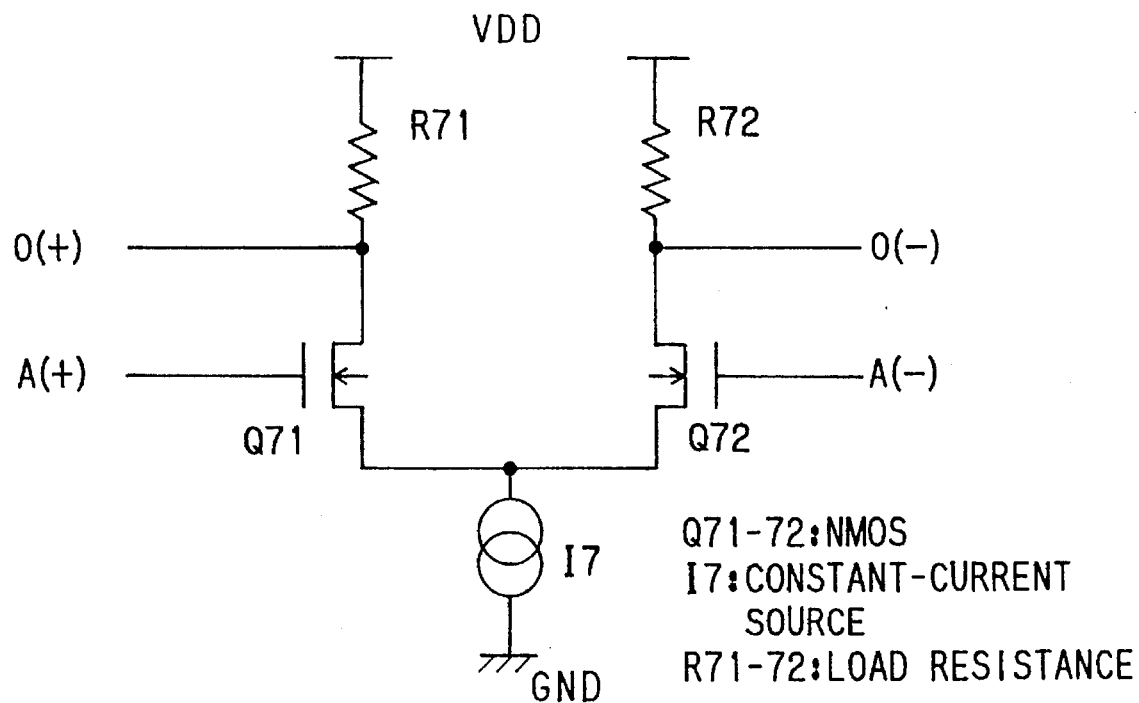
FIG. 3A is a circuit diagram showing a conventional inverter/non-inverter circuit.
FIG. 3B is a logical table showing 0 outputs obtained the circuit in FIG. 3A.

Third, an example of a conventional inverter/non-inverter circuit is shown in FIG. 3A. This circuit comprises NMOS's Q71 and Q72, a constant current source I7 and load resistors R71, R72. The respective positive and negative logical inputs A(+), A(−) are inputted to NMOS's Q71 and Q72, respectively. An output 0 is obtained from the drains of NMOS's Q71 and Q72, respectively. The logical table in this circuit is shown in FIG. 3B.

As mentioned above, in the conventional logical circuits, the AND/NAND circuit in FIG. 1A and the EXOR/EXNOR circuit in FIG. 2A, the respective source and drain of two NMOS's are connected in series between power supplies, and input A or B is inputted to the respective gates of NMOS's. On the other hand, in the inverter/non-inverter circuit in FIG. 3A, the source and drain of single NMOS are connected between power supplies, input A is inputted to the gates of NMOS, and MOS-current mode (MCML) is provided therein. Therefore, operating points thereof are different between the AND/NAND or EXOR/EXNOR circuit and the inverter/non-inverter circuit.

Figures 4A, 4B:
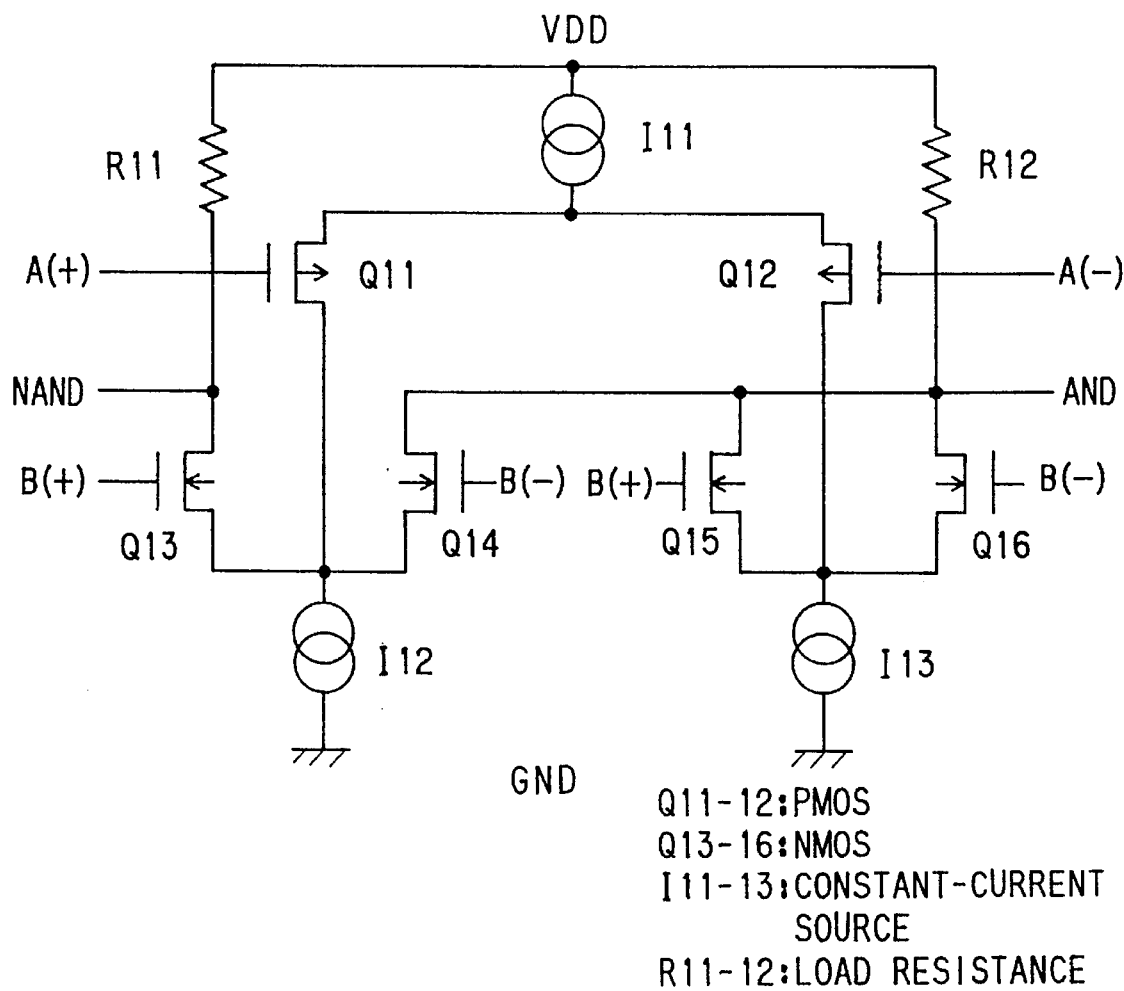
FIG. 4A is a circuit diagram showing a semiconductor integrated circuit in a first preferred embodiment according to the invention which is applied to an AND/NAND circuit.
FIG. 4B is a logical table showing AND/NAND outputs obtained the circuit in FIG. 4A.

Now, the preferred embodiments according to the invention will be explained below with referring to the appended drawings. FIG. 4A is a circuit diagram of the first preferred embodiment which is an example that the invention is applied to an AND/NAND circuit. A pair of P-channel; MOS transistors (hereinafter) referred to as 'PMOS (or PMOS's)'), i.e., PMOS's Q11 and Q12 form a differential pair with sources commonly connected. A constant current source Il1 is connected to the sources thereof, and constant current sources I12, I13 are connected to the respective drains thereof. PMOS's Q11 and Q12 are connected between a power supply VDD and ground, GND to be driven by the constant current source I11. A pair of NMOS's Q13 and Q14 which have mutually different polarity to form a differential pair with sources commonly connected, the drain of NMOS Q13 is connected to the power supply VDD via a load resistor R11, and the drain of NMOS Q14 is connected to the power supply VDD via a load resistor R12. Similarly, a pair of NMOS's Q15 and Q16 which have mutually different polarity to form a differential pair with sources commonly connected, the drains of NMOS Q15 and Q16 are connected to the load resistor R12. These pairs of NMOS's Q13, Q14 and Q15, Q16 are driven by the constant current sources I12 and I13, respectively.

A positive input A(+) is inputted to the gate of PMOS Q11, and a negative input A(−) is inputted to the gate of PMOS Q12. A positive input B(+) is inputted to the respective gates of NMOS's Q13 and Q15, and a negative input B(−) is inputted to the respective gates of NMOS's Q14 and Q16. A NAND output is outputted from the drain of NMOS Q13, and An AND output is outputted from the respective drains of NMOS's Q14, Q15 and Q16.

The logical table showing the AND/NAND output corresponding to inputs A and B is shown in FIG. 4B. For example, if '1' is inputted as the positive input A(+), then PMOS Q11 is OFF, and PMOS Q12 is ON since '0' is inputted as the negative input A(−). Thereby the current from the constant current source I11 flows through PMOS Q12 and NMOS's Q15, Q16 is OFF. At this time, since PMOS Q11 is OFF, NMOS's Q13, Q14 are in the state of normal operation by the constant current source I12. Next, in these NMOS's Q13, Q14, if '1' is inputted as the positive input B(+), then NMOS Q13 is ON, and NMOS Q14 is OFF since the '0' is inputted as the negative input B(−). As a result, the AND output is '1' and the NAND output is '0'. The other AND/NAND outputs as shown in FIG. 4B are obtained by operations similar to the above.

In this circuit, the source and drain of respective PMOS's Q11, Q12 and NMOS's Q13 to Q16 to which inputs A and B are inputted are connected between the power supply VDD and GND while each of these transistors appears as a single element therebetween, whereby the operating points according to the inputs A and B take a MOS-current mode(MCML). Therefore, even if this AND/NAND circuit is cooperated with the inverter/non-inverter circuit as shown in FIG. 3A as one semiconductor integrated circuit, the operating point of the respective AND/NAND circuit and inverter/non-inverter circuit can be equal each other. A level shift circuit can thereby be omitted to simplify the structure of a semiconductor integrated circuit.

Figure 5A:
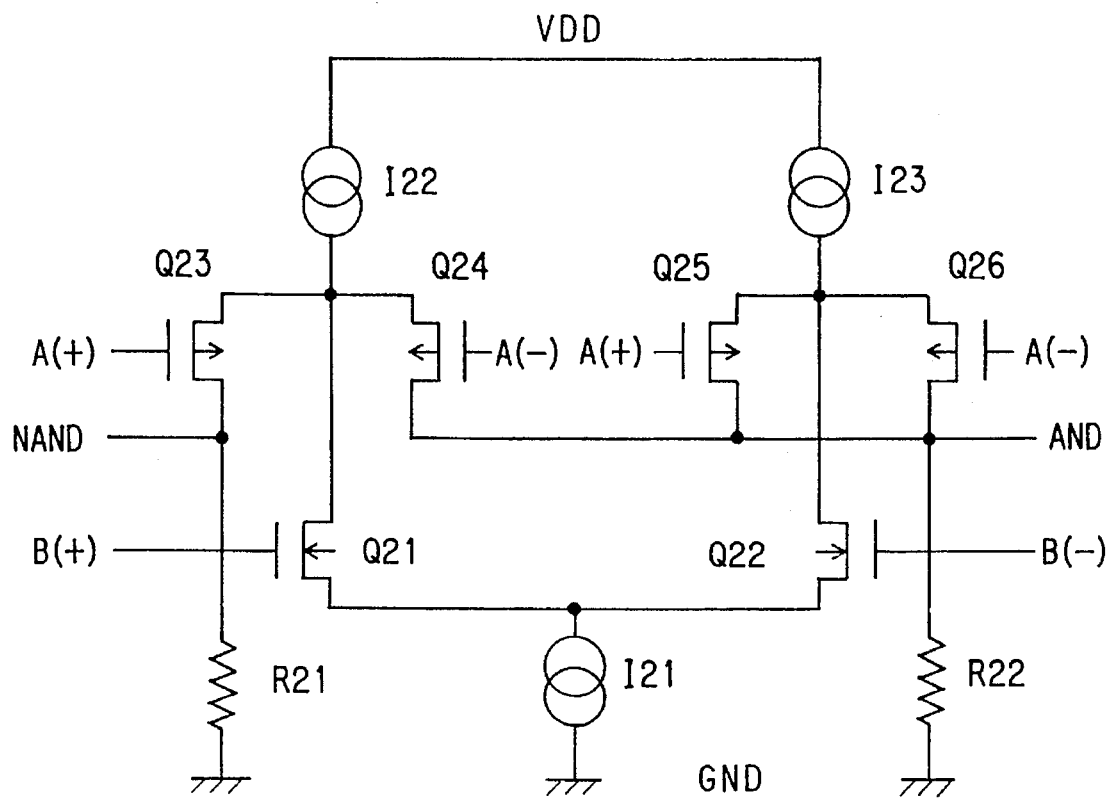
FIG. 5A is a circuit diagram showing a semiconductor integrated circuit in a second preferred embodiment according to the invention which is applied to an AND/NAND circuit.

FIG. 5A is a circuit diagram of the second preferred embodiment which is an example that the invention is applied to an AND/NAND circuit similarly to the first embodiment. In the second embodiment, PMOS's Q11, Q12 and NMOS's Q13 to Q16 in the first embodiment is replaced by NMOS's Q21, Q22 and PMOS's Q23 to Q26, respectively which have a reverse polarity to the former. In response to the replacement, the nodes of load resistors R21, R22 and constant current sources I21 to I23 to a power supply VDD and GND are altered. Also, the connections of inputs A and B are reversed.

Figure 5B:
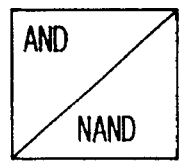
FIG. 5B is a logical table showing AND/NAND outputs obtained the circuit in FIG. 5A.

The logical table of this AND/NAND circuit is shown in FIG. 5B. Similarly to the first embodiment, the source and drain of respective PMOS's Q23 to Q26 and NMOS's Q21, Q22 to which inputs A and B are inputted are connected between the power supply VDD and GND while each of these transistors appears as a single element therebetween, whereby the operating points according to the inputs A and B are operating in a MOS-current mode (MCML). Therefore, even if this AND/NAND circuit is cooperated with the inverter/non-inverter circuit as shown in FIG. 3A as one semiconductor integrated circuit, the operating points of both circuits can be equal each other. A level shift circuit can thereby be omitted to simplify the structure of a semiconductor integrated circuit.

Figures 6A, 6B:
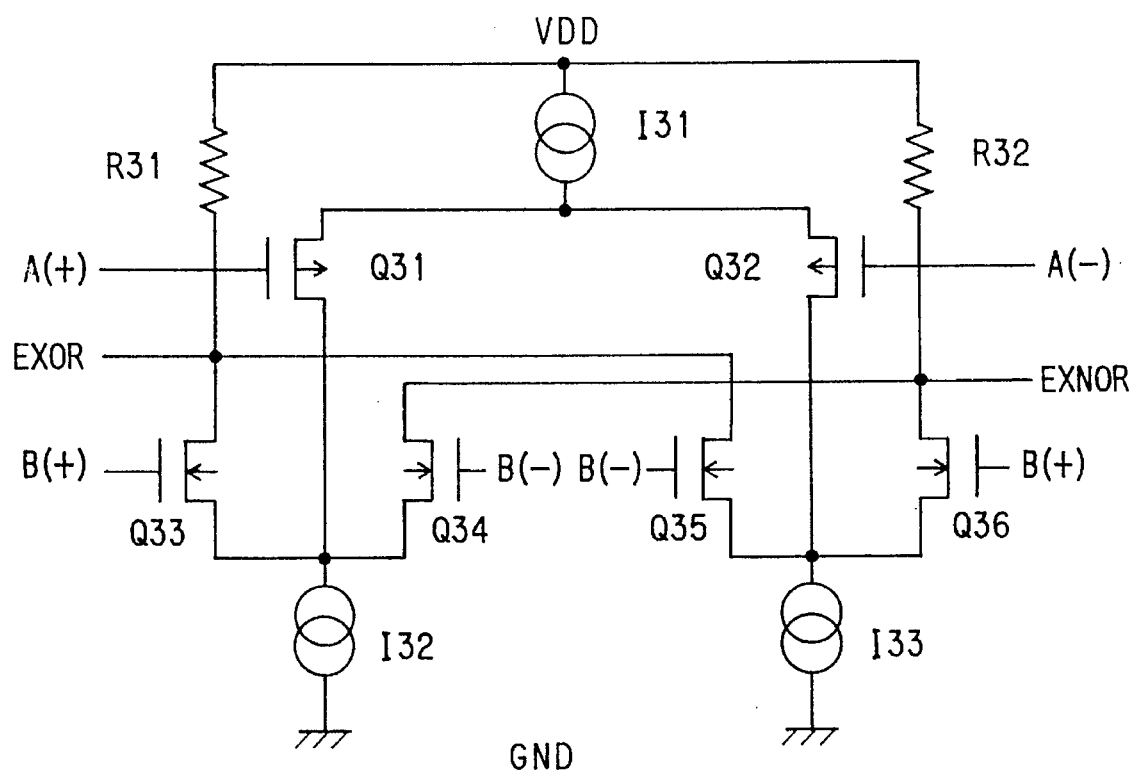
FIG. 6A is a circuit diagram showing a semiconductor integrated circuit in a third preferred embodiment according to the invention which is applied to EXOR/EXNOR circuit.
FIG. 6B is a logical table showing EXOR/EXNOR outputs obtained the circuit in FIG. 6A.

FIG. 6A is a circuit diagram of the third preferred embodiment which is an example that the invention is applied to an EXOR/EXNOR circuit. In the third embodiment, the sources of a pair of PMOS's Q31 and Q32 are mutually connected and they are connected to a constant current source I31, while the respective drains are connected to constant current sources I32 and I33 and are connected with pairs of NMOS's Q33, Q34 and Q35, Q36 which individually have the reverse polarity similarly to the first embodiment. Similarly to the first embodiment, positive and negative inputs A(+), A(−) are inputted to the gates of PMOS's Q31 and Q32, respectively and positive and negative inputs B(+), B(−) are inputted to the gates of NMOS's Q33, Q36 and Q34, Q35, respectively. However, the EXOR output is obtained from the node of the drains of both NMOS's Q33 and Q35 where they are connected with load resistor R31, and the EXNOR output is obtained from the node of the drains of both NMOS's Q34 and Q36 where they are commonly connected with the one end of a load resistor R32.

The logical table showing the EXOR/EXNOR output corresponding to the inputs A and B is shown in FIG. 6B. For example, if '1' is inputted as the positive input A(+), then PMOS Q31 is OFF, and PMOS Q32 is ON since '0' is inputted as the negative input A(−). Thereby the current from the constant current source I31 flows thorough PMOS Q32 and NMOS's Q35, Q36 is OFF. At this time, since PMOS Q31 is OFF, NMOS's Q33, Q34 are in the state of normal operation by the constant current source I32. Next, in these NMOS's Q33, Q34, if '1' is inputted as the positive input B(+), then NMOS Q33 is ON, and NMOS Q34 is OFF since the '0' is inputted as the negative input B(−). As a result, the EXOR output is '0' and the EXNOR output is '1'. The other EXOR/EXNOR outputs as shown in FIG. 6B are obtained by operations similar to the above.

In this circuit, the source and drain of respective PMOS's Q31, Q32 and NMOS's Q33 to Q36 to which the inputs A and B are inputted are connected between the power supply VDD and GND while each of these transistors appears as a single element therebetween, whereby the operating points according to the inputs A and B are operating in a MOS-current mode (MCML). Therefore, even if this EXOR/EXNOR circuit is cooperated with the inverter/non-inverter circuit as shown in FIG. 3A as one semiconductor integrated circuit, the operating points of both the circuits can be equal each other. A level shift circuit can thereby be omitted to simplify the structure of the semiconductor integrated circuit.

Figures 7A, 7B:
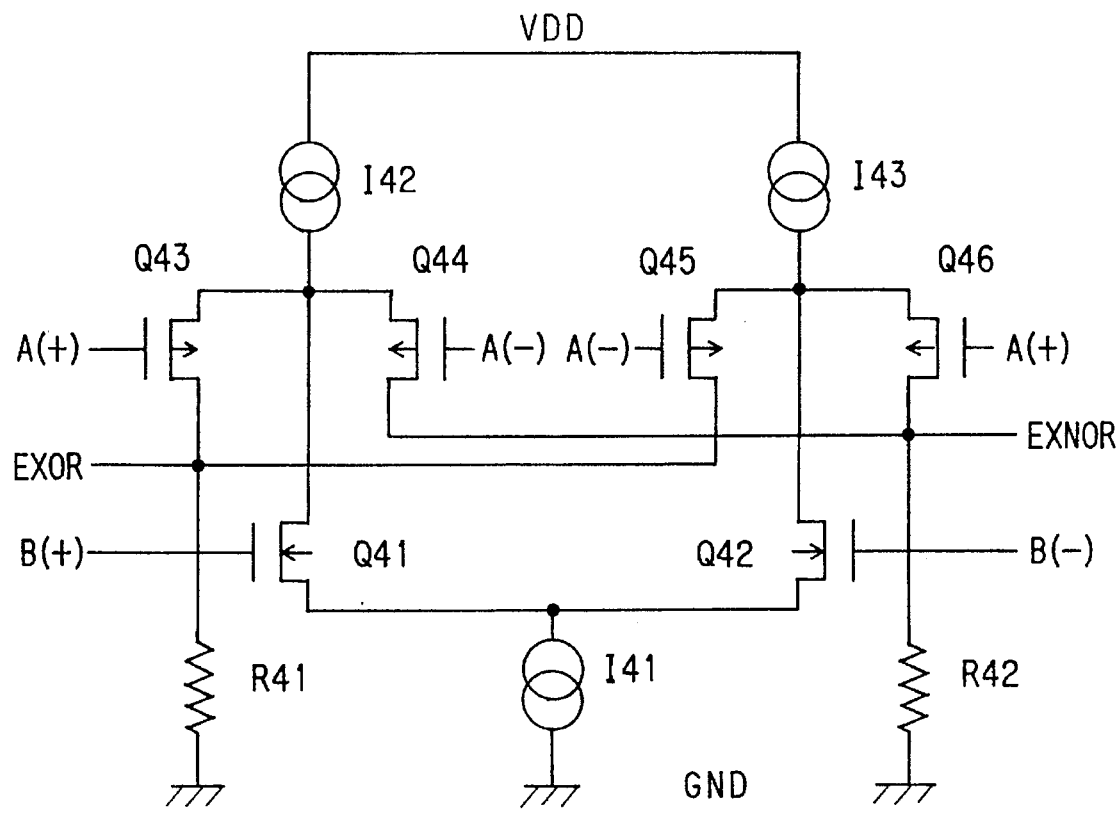
FIG. 7A is a circuit diagram showing a semiconductor integrated circuit in a fourth preferred embodiment according to the invention which is applied to EXOR/EXNOR circuit.
FIG. 7B is a logical table showing EXOR/EXNOR outputs obtained the circuit in FIG. 7A.

FIG. 7A is a circuit diagram of the fourth preferred embodiment which is an example that the invention is applied to an EXOR/EXNOR circuit similarly to the third embodiment. In the fourth embodiment, PMOS's Q31, Q32 and NMOS's Q33 to Q36 in the third embodiment are replaced by NMOS's Q41, Q42 and PMOS's Q43 to Q46, respectively which have individually the reverse polarity to the former. In response to the replacement, the nodes of the load resistors R41, R42 and constant current sources I41 to I43 to a power supply VDD and GND are altered. Also, the connections of the inputs A and B are reversed.

The logical table of this EXOR/EXNOR circuit is shown in FIG. 7B. Similarly to the third embodiment, the source and drain of the respective PMOS's Q43 to Q46 and NMOS's Q41, Q42 to which the inputs A and B are inputted are connected between the power supply VDD and GND while each of these transistors appears as a single element therebetween, whereby the operating points according to the inputs A and B are operating in a MOS-current mode (MCML). Therefore, even if this EXOR/EXNOR circuit is cooperated with the inverter/non-inverter circuit as shown in FIG. 3A as one semiconductor integrated circuit, the operating points of both circuits can be equal each other. A level shift circuit can thereby be omitted to simplify the structure of the semiconductor integrated circuit.

On the other hand, since a resistor value of a diode-connected transistor, i.e., either a source or a drain is connected to a gate, changes around linearly if the ratio of W/L in the gate thereof is reduced, the diode-connected transistor may be used in place of the load resistor used in the above embodiments. Namely, the first and third embodiments may employ a diode-connected PMOS and the second and fourth embodiments may employ a diode-connected NMOS.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A semiconductor integrated circuit, comprising:
   a first pair of transistors of first polarity differentially inputted with first logical values, sources of said first pair of transistors being interconnected;
   a first constant current source for driving said first pair of transistors of said first polarity;
   second and third pairs of transistors of second polarity, each of said second and third pairs of transistors being differentially inputted with second logical values, the sources of each of said second and third pairs of transistors being interconnected and respectively connected to drains of said first pair of transistors;
   second and third constant current sources for driving said second and third pairs of transistors, respectively; and
   load resistors connected to said second and third pairs of transistors, respectively.

2. A semiconductor integrated circuit, comprising:
   a first pair of transistors of first polarity differentially inputted with first logical values, sources of said first pair of transistors being interconnected;
   a first constant current source for driving said first pair of transistors;
   second and third pairs of transistors of second polarity, each of said second and third pairs of transistors being differentially inputted with second logical values, sources of each of said second and third pairs of transistors being interconnected and respectively connected to drains of said first pair of transistors;
   second and third constant current sources for driving said second and third pairs of transistors, respectively; and
   load resistors which are connected to said second and third pairs of transistors, respectively;
   wherein one transistor from said second pair of transistors is connected to one of said load resistors, and the remaining transistors from said second and third pairs of transistors are connected to another of said load resistors, and a NAND output is obtained from a node between said one transistor and said one of said load resistors, and an AND output is obtained from a node between said remaining transistors and said another of said load resistors.

3. A semiconductor integrated circuit, comprising:
   a first pair of transistors of first polarity differentially inputted with first logical values, sources of said first pair of transistors being interconnected;

a first constant current source for driving said first pair of transistors;

second and third pairs of transistors of second polarity, said second pair of transistors comprising first and second transistors differentially inputted with second logical values and said third pair of transistors comprising third and fourth transistors differentially inputted with said second logical values, sources of said first and second transistors being interconnected and connected to a drain of one transistor of said first pair of transistors, sources of said third and fourth transistors being interconnected and connected to a drain of the other transistor of said first pair of transistors;

second and third constant current sources for driving said second and third pairs of transistors, respectively; and load resistors which are connected to said second and third pairs of transistors, respectively;

wherein drains of said first and third transistors are connected to one of said load resistors, said first and third transistors being differentially inputted, and drains of said second and fourth transistors are connected to another of said load resistors, said second and fourth transistors being differentially inputted, and wherein an EXOR output is obtained from a node between said first and third transistors and said one of said load resistors and an EXNOR output is obtained from a node between said second and fourth transistors and said another of said load resistors.

4. The semiconductor integrated circuit of claim 1 further comprising:

an inverter/non-inverter circuit having a fourth pair of transistors, said fourth pair of transistors being differentially inputted with one of said first and second logical values, whereby operating points and modes of said first, second, third and fourth pairs of transistors are identical without utilizing a level shift circuit in said semiconductor integrated circuit.

5. The semiconductor integrated circuit of claim 2 further comprising:

an inverter/non-inverter circuit having a fourth pair of transistors, said fourth pair of transistors being differentially inputted with one of said first and second logical values, whereby operating points and modes of said first, second, third and fourth pairs of transistors are identical without utilizing a level shift circuit in said semiconductor integrated circuit.

6. The semiconductor integrated circuit of claim 3 further comprising:

an inverter/non-inverter circuit having a fourth pair of transistors, said fourth pair of transistors being differentially inputted with one of said first and second logical values, whereby operating points and modes of said first, second, third and fourth pairs of transistors are identical without utilizing a level shift circuit in said semiconductor integrated circuit.

* * * * *

UNITED STATES PATENT AND TRADEMARK OFFICE
CERTIFICATE OF CORRECTION

PATENT : 5,583,456
DATED : December 10, 1996
INVENTOR(S): Katsuji KIMURA

It is certified that error appears in the above-identified patent and that said Letters Patent is hereby corrected as shown below:  On the title page: Item [54]

In the Title:   Change "XOR/XNOR" to --EXOR/EXNOR--.

Signed and Sealed this

Third Day of April, 2001

*Attest:*

NICHOLAS P. GODICI

*Attesting Officer*   Acting Director of the United States Patent and Trademark Office